(12) United States Patent
Hsieh et al.

(10) Patent No.: US 12,713,742 B2
(45) Date of Patent: Aug. 18, 2026

(54) ELECTRONIC DEVICE

(71) Applicant: InnoLux Corporation, Miao-Li County (TW)

(72) Inventors: Chia-Hsien Hsieh, Miao-Li County (TW); Hong-Sheng Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 458 days.

(21) Appl. No.: 18/206,599

(22) Filed: Jun. 6, 2023

(65) Prior Publication Data

US 2024/0014359 A1 Jan. 11, 2024

(30) Foreign Application Priority Data

Jul. 5, 2022 (CN) ......................... 202210792805.9

(51) Int. Cl.
*H10H 20/855* (2025.01)
*B60K 35/22* (2024.01)
(Continued)

(52) U.S. Cl.
CPC ........... *H10H 20/855* (2025.01); *B60K 35/22* (2024.01); *B60K 35/415* (2024.01);
(Continued)

(58) Field of Classification Search
CPC .. H10H 20/855; H10H 20/854; H10H 20/853; H10H 20/856; B60K 35/22;
(Continued)

(56) References Cited

U.S. PATENT DOCUMENTS

2020/0335482 A1* 10/2020 Mladenovski ....... H10H 20/856
2021/0351331 A1* 11/2021 Li ....................... H10H 20/855
(Continued)

FOREIGN PATENT DOCUMENTS

CN 203277490 U 11/2013
CN 111512437 A 8/2020
(Continued)

*Primary Examiner* — Charles S Chang
(74) *Attorney, Agent, or Firm* — Winston Hsu

(57) ABSTRACT

An electronic device includes a substrate, an electronic component, a first blocking structure and a packaging layer. The substrate defines a normal direction perpendicular to a surface of the substrate. The electronic component is disposed on the substrate. The first blocking structure is disposed adjacent to a side of the electronic component. The packaging layer is disposed on the electronic component and has a refractive index n at a wavelength of 550 nm. The electronic component has a width W in a first direction perpendicular to the normal direction. A distance H is between a surface of the first blocking structure away from the substrate and the surface of the substrate in the normal direction. A spaced distance P1 is between the surface of the first blocking structure away from the substrate and the electronic component in the first direction. Following relationship is satisfied:

$$H=n\times[(P1+W)/\tan\theta].$$

18 Claims, 11 Drawing Sheets

(51) Int. Cl.
*B60K 35/40* (2024.01)
*H10H 20/854* (2025.01)
*H10W 90/00* (2026.01)
*B60K 35/60* (2024.01)

(52) U.S. Cl.
CPC ......... *B60K 35/425* (2024.01); *H10H 20/854* (2025.01); *H10W 90/00* (2026.01); *B60K 35/60* (2024.01); *B60K 2360/785* (2024.01)

(58) Field of Classification Search
CPC .... B60K 35/415; B60K 35/425; B60K 35/60; B60K 2360/785; H01L 25/167; H01L 25/0753
See application file for complete search history.

(56) References Cited

U.S. PATENT DOCUMENTS

| | | | | |
|---|---|---|---|---|
| 2022/0059607 | A1* | 2/2022 | Murugan | H10H 20/855 |
| 2024/0369922 | A1* | 11/2024 | Toyooka | G03F 7/004 |
| 2025/0113677 | A1* | 4/2025 | Li | H10H 20/857 |

FOREIGN PATENT DOCUMENTS

| | | | |
|---|---|---|---|
| CN | 114137753 | A | 3/2022 |
| TW | 200919779 | A | 5/2009 |

* cited by examiner

ELECTRONIC DEVICE

BACKGROUND OF THE DISCLOSURE

1. Field of the Disclosure

The present disclosure relates to an electronic device, and more particularly, to an electronic device having a blocking structure.

2. Description of the Prior Art

With the advancement of technology, electronic devices equipped with displays have become indispensable in modern life. When the electronic devices are applied to vehicles, the light emitted from the electronic device may be projected onto the windshield and interfere the driver's sight.

Therefore, how to reduce the aforementioned problem has become an important subject.

SUMMARY OF THE DISCLOSURE

According to an embodiment of the present disclosure, an electronic device includes a substrate, an electronic component, a first blocking structure and a packaging layer. The substrate defines a normal direction perpendicular to a surface of the substrate. The electronic component is disposed on the substrate. The first blocking structure is disposed adjacent to aside of the electronic component. The packaging layer is disposed on the electronic component and has a refractive index n at a wavelength of 550 nm. The electronic component has a width W in a first direction perpendicular to the normal direction. A distance H is between a surface of the first blocking structure away from the substrate and the surface of the substrate in the normal direction. A spaced distance P1 is between the surface of the first blocking structure away from the substrate and the electronic component in the first direction, and the following relationship is satisfied: $H=n\times[(P1+W)/\tan\ \theta]$, wherein $30°\leq\theta\leq60°$.

According to another embodiment of the present disclosure, an electronic device includes a substrate, an electronic component, a first blocking structure and a packaging layer. The substrate defines a normal direction perpendicular to a surface of the substrate. The electronic component is disposed on the substrate. The first blocking structure is disposed adjacent to aside of the electronic component. The packaging layer includes m sub-layers sequentially disposed on the electronic component, wherein m is a positive integer greater than 1. A name of each of the sub-layers is defined as a $i^{th}$ sub-layer, the $i^{th}$ sub-layer has a refractive index ni at a wavelength of 550 nm, the $i^{th}$ sub-layer has a height Hi in the normal direction, i is a positive integer from 1 to m, the electronic component has a width W in a first direction perpendicular to the normal direction, a distance H is between a surface of the first blocking structure away from the substrate and the surface of the substrate in the normal direction, a spaced distance P1 is between the surface of the first blocking structure away from the substrate and the electronic component in the first direction, and the following relationships are satisfied:

$$\sum_{i=1}^{m} Hi/ni = [(P1+W)/\tan\theta],$$

wherein $30°\leq\theta\leq60°$; and $$H=\sum_{i=1}^{m} Hi.$$

These and other objectives of the present disclosure will no doubt become obvious to those of ordinary skill in the art after reading the following detailed description of the embodiment that is illustrated in the various figures and drawings.

DETAILED DESCRIPTION

Figure 1:
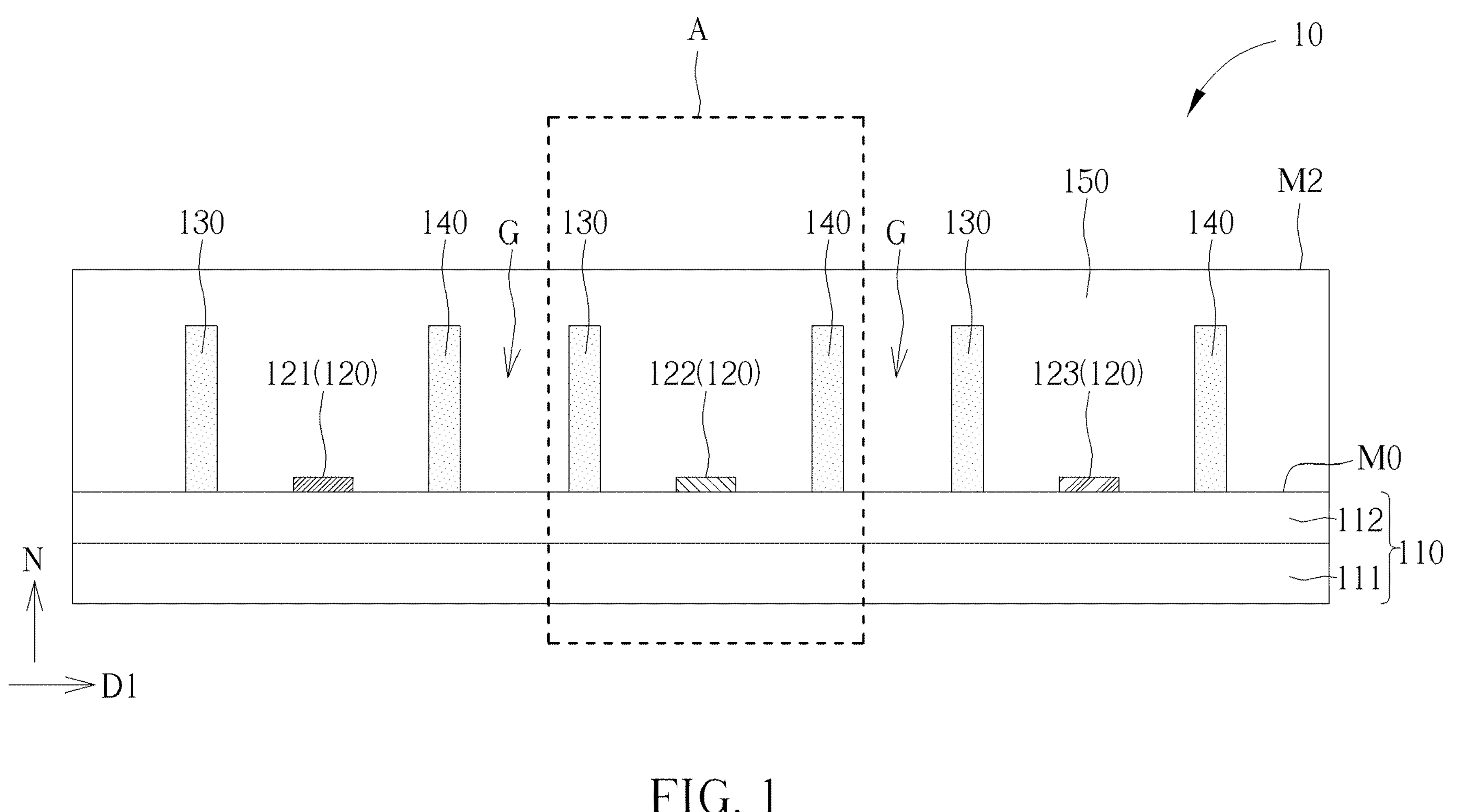
FIG. 1 is a schematic diagram showing a partial cross-sectional view of an electronic device according to an embodiment of the present disclosure.

The present disclosure may be understood by reference to the following detailed description, taken in conjunction with the drawings as described below. Wherever possible, the same or similar parts in the drawings and descriptions are represented by the same reference numeral.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "have" and "include/comprise" are used in an open-ended fashion, and thus should be interpreted to mean "include, but not limited to . . . ".

In the present disclosure, the directional terms, such as "on/up/above", "down/below", "front", "rear/back", "left", "right", etc., are only directions referring to the drawings. Therefore, the directional terms are used for explaining and not used for limiting the present disclosure. Regarding the drawings, the drawings show the general characteristics of methods, structures and/or materials used in specific embodiments. However, the drawings should not be construed as defining or limiting the scope or properties encompassed by these embodiments. For example, for clarity, the relative size, thickness, and position of each layer, each area and/or each structure may be reduced or enlarged.

In the present disclosure, when a structure (or layer, or component, or substrate) is described as located on/above another structure (or layer, or component, or substrate), it may refer that the two structures are adjacent and directly connected with each other, or the two structures are adjacent and indirectly connected with each other. The two structures being indirectly connected with each other may refer that at least one intervening structure (or intervening layer, or intervening component, or intervening substrate, or intervening interval) exists between the two structures, a lower surface of one of the two structure is adjacent or directly connected with an upper surface of the intervening structure, and an upper surface of the other of the two structures is adjacent or directly connected with a lower surface of the intervening structure. The intervening structure may be a single-layer or multi-layer physical structure or a non-physical structure, and the present disclosure is not limited thereto. In the present disclosure, when a certain structure is disposed "on/above" other structures, it may refer that the certain structure is "directly" disposed on/above the other structures, or the certain structure is "indirectly" disposed on/above the other structures, i.e., at least one structure is disposed between the certain structure and the other structures.

The terms "about", "equal", "identical", "the same", "substantially" or "approximately" mentioned in this document generally mean being within 20% of a given value or range, or being within 10%, 5%, 3%, 2%, 1% or 0.5% of the given value or range.

Furthermore, any two values or directions used for comparison may have a certain error. If a first value is equal to a second value, it implies that there may be an error of about 10% between the first value and the second value; if a first direction is perpendicular or "substantially" perpendicular to a second direction, then an angle between the first direction and the second direction may be between 80 degrees to 100 degrees; if the first direction is parallel or "substantially" parallel to the second direction, an angle between the first direction and the second direction may be between 0 degree to 10 degrees.

Although ordinal numbers such as "first", "second", etc., may be used to describe an element (or elements) in the description and the claims, it does not imply and represent that the element (or those elements) have any previous ordinal number. The ordinal numbers do not represent the order of the elements or the manufacturing order of the elements. The ordinal numbers are only used for discriminate an element with a certain designation from another element with the same designation. The claims and the description may not use the same terms. Accordingly, a first element in the description may be a second element in the claims.

In addition, the term "a given range is from a first value to the second value" or "a given range falls within a range from a first value to a second value" refers that the given range includes the first value, the second value and other values therebetween.

Moreover, the electronic device of the present disclosure may include a display device, a backlight device, an antenna device, a sensing device, a tiled device, a touch display device, a curved display device or a free shape display device, but not limited thereto. The electronic device may exemplarily include liquid crystals, light emitting diodes, fluorescence, phosphor, other suitable display media or a combination thereof, but not limited thereto. The display device may be a non-self-luminous type display device or a self-luminous type display device. The antenna device may be a liquid-crystal-type antenna device or a non-liquid-crystal-type antenna device. The sensing device may be a device for sensing capacitance, light, thermal or ultrasonic, but not limited thereto. The electronic components of the electronic device may include passive components and active components, such as capacitors, resistors, inductors, diodes, transistors, etc., but not limited thereto. The diode may include a light emitting diode (LED) or a photodiode. The light emitting diode may include organic light emitting diode (OLED), mini LED, micro LED or quantum dot LED, but not limited thereto. The tiled device may be, for example, a tiled display device or a tiled antenna device, but not limited thereto. Furthermore, the electronic device may be any combination of the aforementioned devices, but not limited thereto. Furthermore, the electronic devices may be foldable or flexible electronic devices. The electronic device may be any combination of the aforementioned devices, but not limited thereto. Furthermore, a shape of the electronic device may be a rectangle, a circle, a polygon, a shape with curved edge or other suitable shape. The electronic device may have peripheral systems, such as a driving system, a control system, a light system, shelf system, etc., for supporting the display device, the antenna device or the tiled device.

In the present disclosure, it should be understood that a depth, a thickness, a width or a height of each element, or a spaced distance or a distance between elements may be measured by an optical microscopy (OM), a scanning electron microscope (SEM), a film thickness profiler (α-step), an ellipsometer or other suitable methods. In some embodiments, a cross-sectional image including elements to be measured may be obtained by the SEM, and the depth, the thickness, the width or the height of each element, or the spaced distance or the distance between elements can be measured thereby.

It should be noted that the technical features in different embodiments described in the following can be replaced, recombined, or mixed with one another to constitute another embodiment without departing from the spirit of the present disclosure.

Unless otherwise defined, all terms (including technical and scientific terms) used herein have the same meaning as commonly understood by a person having ordinary skill in the art to which the disclosure belongs. It can be understood that these terms, such as those defined in commonly used dictionaries, should be interpreted as having meanings consistent with the background or context of the related technology and the present disclosure, and should not be interpreted in an idealized or overly formal manner, unless otherwise specified in the disclosed embodiments.

Please refer to FIG. 1, which is a schematic diagram showing a partial cross-sectional view of an electronic device 10 according to an embodiment of the present disclosure. In the embodiment, the electronic device 10 is applied as a display device, but not limited thereto. The electronic device 10 may also include other functions, such as touch and detection, but not limited thereto. The electronic device 10 at least includes a substrate 110, an electronic component 120, a first blocking structure 130 and/or a packaging layer 150. The electronic component 120 may include a light emitting element, but not limited thereto. The electronic device 10 may include a plurality of electronic components 120. FIG. 1 exemplarily shows three electronic components 120, but not limited thereto. The substrate 110 has a surface M0, and the surface M0 has a normal direction N. In other words, a normal direction N perpendicular to the surface M0 of the substrate 110 may be defined. The electronic component 120 is disposed on the substrate 110. The first blocking structure 130 is disposed adjacent to a side of the electronic component 120. For example, one first blocking structure 130 may be respectively disposed on the same side of each of the electronic components 120, but not limited thereto. The packaging layer 150 is disposed on the electronic components 120. In some embodiments, the packaging layer 150 may cover the plurality of electronic components 120, but not limited thereto. In some embodiments, the packaging layer 150 has a refractive index "n" at a wavelength of 550 nm. Please further refer to FIG. 2, which is an enlarged view of a portion A in FIG. 1. The electronic component 120 has a width W in a first direction D1 perpendicular to the normal direction N, a distance H is between a surface S1 of the first blocking structure 130 away from the substrate 110 and the surface M0 of the substrate 110 in the normal direction N, a spaced distance P1 is between the surface S1 of the first blocking structure 130 away from the substrate 110 and the electronic component 120 in the first direction D1, and the following relationship is satisfied:

$$H=n\times[(P1+W)/\tan\theta], \text{ wherein } 30°\leq\theta\leq60°.$$

With the aforementioned configuration, a portion of the light emitted from the electronic component 120 can be blocked, for example, by the first blocking structure 130, so that the emitting range of the light emitted from the electronic device 10 can be controlled, and the electronic device 10 can have an anti-peeping function.

The included angle θ may be defined as an included angle between the normal direction N and a connecting line L of a side B1 of the surface S1 of the first blocking structure 130 away from the substrate 110 adjacent to the electronic component 120 and a side B2 of a top portion of the electronic component 120 away from the first blocking structure 130.

The electronic device 10 may further include a second blocking structure 140 disposed adjacent to another side of the electronic component 120. The first blocking structure 130 and the second blocking structure 140 are sequentially arranged along the first direction D1. For example, when the electronic device 10 includes a plurality of electronic components 120, the first blocking structure 130 may be disposed adjacent to one side (the left side in FIG. 1) of each of the electronic components 120, and the second blocking structure 140 may be disposed adjacent to another side (the right side in FIG. 1) of each of the electronic components 120, but not limited thereto. A spaced distance P2 is between a surface S2 of the second blocking structure 140 away from the substrate 110 and the electronic component 120 in the first direction D1. According to one embodiment of the present disclosure, the spaced distance P1 may be equal to the spaced distance P2. Thereby, the shielding ranges of the first blocking structure 130 and the second blocking structure 140 for the light emitted from the electronic component 120 are identical. Furthermore, since the corresponding relationship between the electronic component 120 and the first blocking structure 130 is identical to the corresponding relationship between the electronic component 120 and the second blocking structure 140, the probability of the generation of Moiré pattern in the first direction D1 can be reduced. The corresponding relationship between the electronic component 120 and the first blocking structure 130 being identical to the corresponding relationship between the electronic component 120 and the second blocking structure 140 refers that the electronic component 120 substantially overlap with the first blocking structure 130 and the second blocking structure 140 in the first direction D1.

Figure 2:
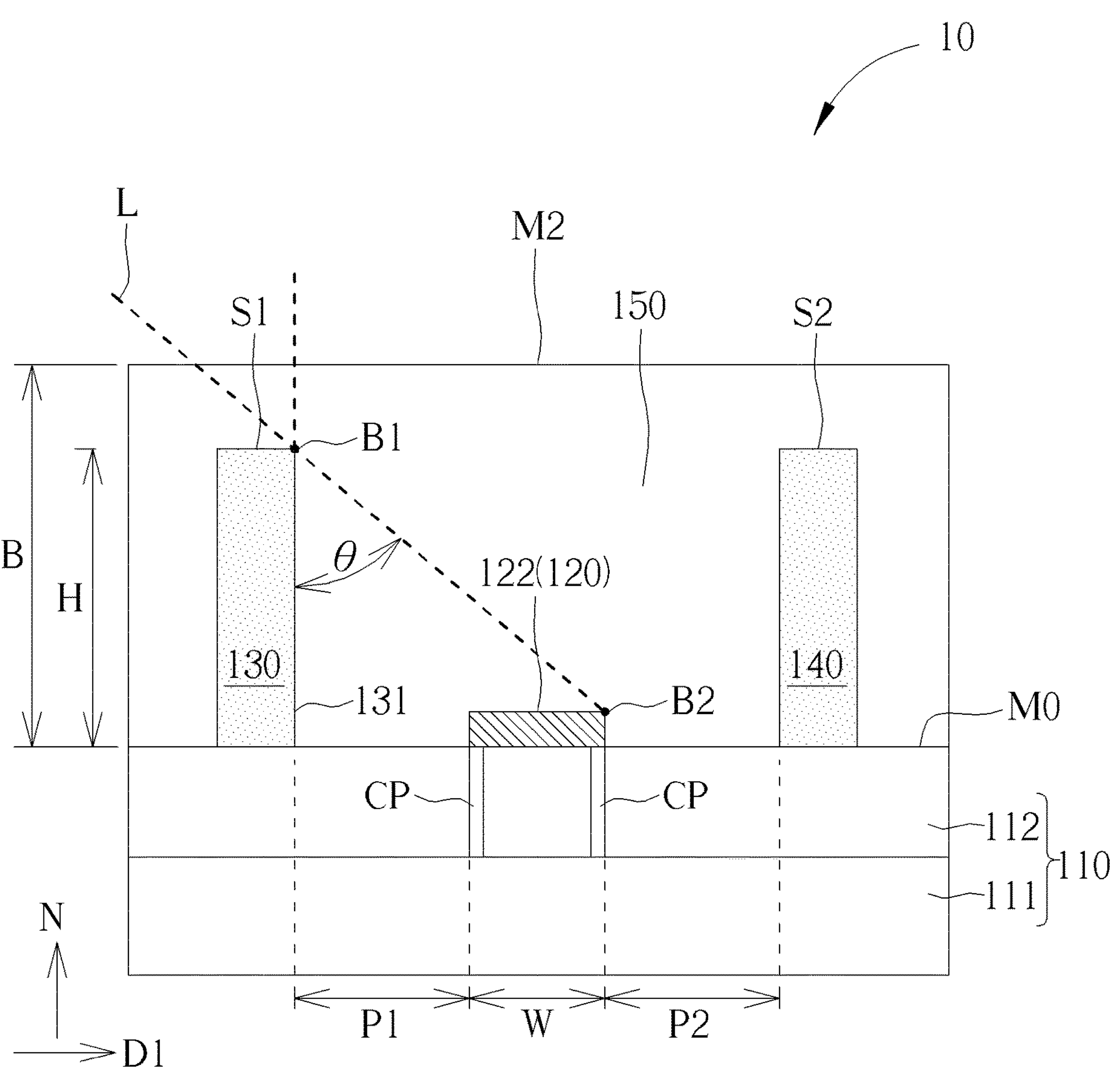
FIG. 2 is a schematic diagram showing an enlarged view of a portion A in FIG. 1.

According to one embodiment of the present disclosure, the spaced distance P1 may be different from the spaced distance P2. Thereby, the shielding ranges of the first blocking structure 130 and the second blocking structure 140 for the light emitted from the electronic component 120 are different, so that the asymmetric light shielding or anti-peeping function can be achieved. For example, when the spaced distance P1 is less than the spaced distance P2, the light shielding range of the first blocking structure 130 may be larger than the light shielding range of the second blocking structure 140. For example, when the electronic device 10 is applied to a vehicle, and the first blocking structure 130 shown in FIG. 2 is closer to the windshield than the second blocking structure 140, the ratio of light emitted to the windshield can be reduced, and the problem that the reflection on the windshield formed by the light interferes the driver's sight may be reduced, so as to improve the driving safety.

According to one embodiment of the present disclosure, the spaced distance P1 and the spaced distance P2 may satisfy the following relationship: $1<P2/P1\leq4$, but not limited thereto. Thereby, a more significant asymmetric anti-peeping effect can be provided. In some embodiments, the spaced distance P1 and the spaced distance P2 may satisfy the following relationship: $1<P2/P1\leq3$, but not limited thereto. In some embodiments, the spaced distance P1 and the spaced distance P2 may satisfy the following relationship: $1<P2/P1\leq2.5$, but not limited thereto.

According to one embodiment of the present disclosure, the distance H is between the surface S1 of the first blocking structure 130 away from the substrate 110 and the surface M0 of the substrate 110 in the normal direction N, and the following formula may be satisfied: 30 μm≤H≤150 μm. When the distance H is less than 30 μm, the light shielding effect provided by the first blocking structure 130 is limited; when the distance H is greater than 150 μm, the overall thickness of the electronic device 10 may be increased. In some embodiments, the distance H may satisfy the following formula: 50 μm≤H≤100 μm.

The electronic device 10 may be exemplarily a self-luminous type electronic device or a non-self-luminous type electronic device. When the electronic device 10 is a self-luminous type electronic device, the substrate 110 may be, for example, a substrate of a panel. When the electronic device 10 is a non-self-luminous type electronic device, the substrate 110 may be, for example, a substrate of a backlight module, and a panel (not shown) may be further disposed on the backlight module.

In some embodiments, the substrate 110 may include a circuit board 111 and a bottom layer 112. The circuit board 111 and the electronic component 120 are electrically connected, for example, through conductive pads CP, as shown in FIG. 2. In FIG. 1 or other drawings, the conductive pads CP are omitted for the sake of simplicity. The electronic component 120 may be controlled through the circuit design on the circuit board 111. For example, the opening and closing of the electronic component 120 may be controlled. The bottom layer 112 is disposed on the circuit board 111. In some embodiments, the bottom layer 112 may include an absorbing material, which can absorb a portion of the light emitted from the electronic component 120, so as to reduce the problem that the image quality is affected by the second reflection of the light through the bottom layer 112, but not limited thereto. In some embodiments, the bottom layer 112 may include a reflective material, and the reflective material includes a white reflective material or a metal reflective material. For example, the bottom layer 112 may be configured to reflect and reuse the light emitted from the electronic component 120 to improve brightness, but not limited thereto. In other words, the material of the bottom layer 112 may be adjusted according to the required properties of the electronic device 10. The aforementioned "absorbing material" may be a light absorbing material, such as a material with an absorbance for visible light (such as visible light with a wavelength of 550 nm) greater than or equal to 80% and less than or equal to 100%, but not limited thereto. The aforementioned "reflective material" may be a light reflective material, such as a material with a reflectivity for visible light (such as visible light with a wavelength of 550 nm) greater than or equal to 80% and less than or equal to 100%, but not limited thereto.

Herein, the electronic components 120 are exemplarily light emitting elements, and the number of the electronic components 120 is exemplarily three, which are a first light emitting element 121, a second light emitting element 122 and a third light emitting element 123, but not limited thereto. For example, the first light emitting element 121, the second light emitting element 122 and the third light emitting element 123 emit different lights, such as red light, green light or blue light, but not limited thereto. In other embodiments, the electronic component 120 can be other light emitting elements, and the quantity and the color of the electronic component 120 may be adjusted according to actual needs.

According to the present disclosure, the first blocking structure 130 and the second blocking structure 140 may be disposed on the surface of the bottom layer 112 and contact the bottom layer 112. Since the distance between the first blocking structure 130 and the bottom layer 112 and the distance between the second blocking structure 140 and the bottom layer 112 are almost 0, or the first blocking structure 130 and the second blocking structure 140 substantially directly contact the bottom layer 112, problems such as ghost image or blurry image can be reduced. The first blocking structure 130, the second blocking structure 140 and the bottom layer 112 may be independent components, or the first blocking structure 130, the second blocking structure 140, and the bottom layer 112 may be integrally formed.

The first blocking structure 130 may be a single-layer structure, but not limited thereto. The first blocking structure 130 may include an absorbing material or a reflective material. For the absorbing material (such as black ink and a black photoresist) and the reflective material, references may be made to the above description and are not repeated herein. In some embodiments, the absorbing material may exemplarily include black ink, a black photoresist, other suitable material or a combination thereof. In some embodiments, the reflective material may exemplarily include a white reflective material or a metal reflective material, other suitable material or a combination thereof. For details of the second blocking structure 140, references may be made to that of the first blocking structure 130 and are not repeated herein. Herein, the "absorbing material" may be exemplarily a material with a transmittance for visible light (such as visible light with a wavelength of 550 nm) greater than or equal to 0% and less than 60%, but not limited thereto. Herein, the "reflective material" may be exemplarily a material with a reflectivity for visible light (such as visible light with a wavelength of 550 nm) greater than or equal to 60% and less than or equal to 100%, but not limited thereto.

In some embodiments, the material of the packaging layer 150 may include but not limited to a transparent packaging material, such as a transparent resin or silicone, but not limited thereto. In FIG. 1, a gap G is between the first blocking structure 130 and the second blocking structure 140 of two adjacent electronic components 120 (such as the first light emitting element 121 and the second light emitting element 122), and the packaging layer 150 may be exemplarily disposed in the gap G. In the embodiment, as shown in FIG. 2, a distance B between the surface M2 of the packaging layer 150 away from the substrate 110 and the surface M0 of the substrate 110 in the normal direction N is greater than the distance H. As shown in FIG. 2, the packaging layer 150 exemplarily covers the first blocking structure 130 and/or the second blocking structure 140, the surface S1 of the first blocking structure 130 away from the substrate 110 may be lower than the surface M2 of the packaging layer 150 away from the substrate 110, and the surface S2 of the second blocking structure 140 away from the substrate 110 may be lower than the surface M2 of the packaging layer 150 away from the substrate 110, but not limited thereto. In other embodiments (such as FIG. 3), the distance B may be substantially equal to the distance H. In other embodiments, the distance B may be less than the distance H.

Figure 3:
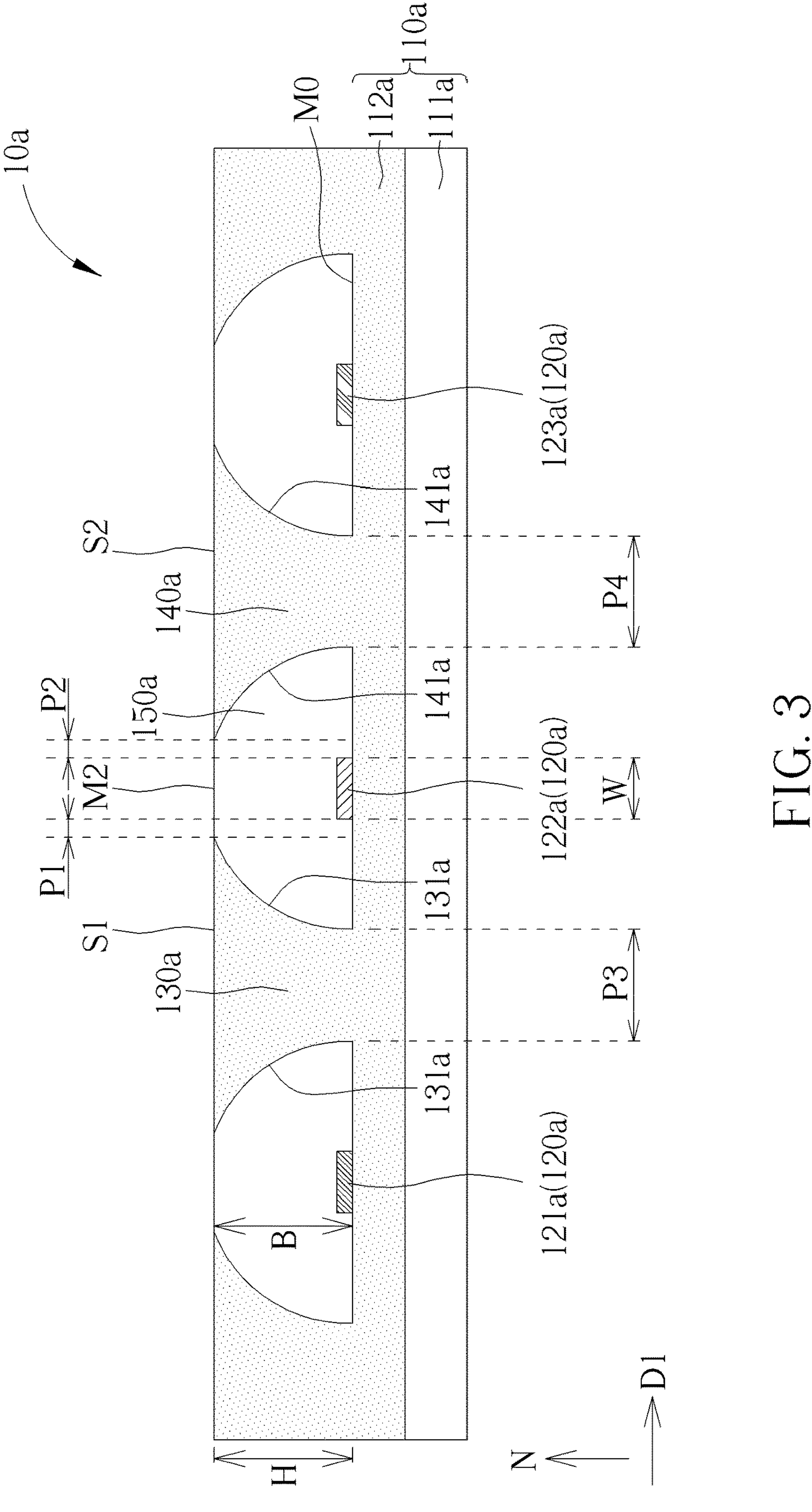
FIG. 3 is a schematic diagram showing a partial cross-sectional view of an electronic device according to another embodiment of the present disclosure.

FIG. 3 is a schematic diagram showing a partial cross-sectional view of an electronic device 10*a* according to another embodiment of the present disclosure. The electronic device 10*a* at least includes a substrate 110*a*, an electronic component 120*a*, a first blocking structure 130*a*, a second blocking structure 140*a* and/or a packaging layer 150*a*, but not limited thereto. The substrate 110*a* may include a circuit board 111*a* and/or a bottom layer 112*a*, but not limited thereto. Compared with the electronic device 10, the first blocking structure 130*a*, the second blocking structure 140*a* and the bottom layer 112*a* of the electronic device 10*a* may be exemplarily integrally formed. In some embodiments, the side surface 131*a* of the first blocking structure 130*a* of the electronic device 10*a* may be a curved surface. For example, the first blocking structure 130*a* may include two side surfaces 131*a* that are symmetrical to each other, and the two side surfaces 131*a* are curved surfaces, but not limited thereto. Similarly, the side surface 141*a* of the second blocking structure 140*a* may exemplarily be a curved surface. For example, the second blocking structure 140*a* may include two side surfaces 141*a* that are symmetrical to each other, and the two side surfaces 141*a* are curved surfaces, but not limited thereto. Through the above design, the cross section of the space between the first blocking structure 130*a* and the second blocking structure 140*a* may present, for example, an inverted U-shaped profile. In some embodiments, the packaging layer 150*a* may be disposed, for example, in the space between the first blocking structure 130*a* and the second blocking structure 140*a*. In some embodiments, the width P3 of the first blocking structure 130*a* in the first direction D1 may be, for example, gradually increased from the substrate 110*a* along the normal direction N away from the substrate 110*a*, but not limited thereto. In some embodiments, the width P4 of the second blocking structure 140*a* in the first direction D1 may be, for example, gradually increased from the substrate 110*a* along the normal direction N away from the substrate 110*a*, but not limited thereto. The gradual increase of the aforementioned width is not required to increase proportionally. In the embodiment shown in FIG. 3, two adjacent electronic components 120*a* (such as the first light emitting element 121*a* and the second light emitting element 122*a*, or the second light emitting element 122*a* and the third light emitting element 123*a*) may exemplarily share a same blocking structure. That is, the first blocking structure 130*a* of the second light emitting element 122*a* may be regarded as the second blocking structure of the first light emitting element 121*a*, and the second blocking structure 140*a* of the second light emitting element 122*a* may be regarded as the first blocking structure of the third light emitting element 123*a*, and so on, but not limited thereto. In some embodiments, the distance B between the surface M2 of the packaging layer 150*a* away from the substrate 110*a* and the surface M0 of the substrate 110*a* in the normal direction N may be substantially equal to the distance H (i.e., the height of the first blocking structure 130*a*), but not limited thereto. In other words, the surface M2 of the packaging layer 150*a* away from the substrate 110*a* may be substantially aligned with the surface S1 of the first blocking structure 130*a* away from the substrate 110*a* and/or the surface S2 of the second blocking structure 140*a* away from the substrate 110*a*. In some embodiments, the distance B may be greater or less than the distance H (i.e., the height of the first blocking structure 130*a*). Other details of the electronic device 10*a* shown in FIG. 3 may be the same as that of the electronic device 10 shown in FIGS. 1 and 2 if there is no contradiction, and are not repeated herein.

Figure 4:
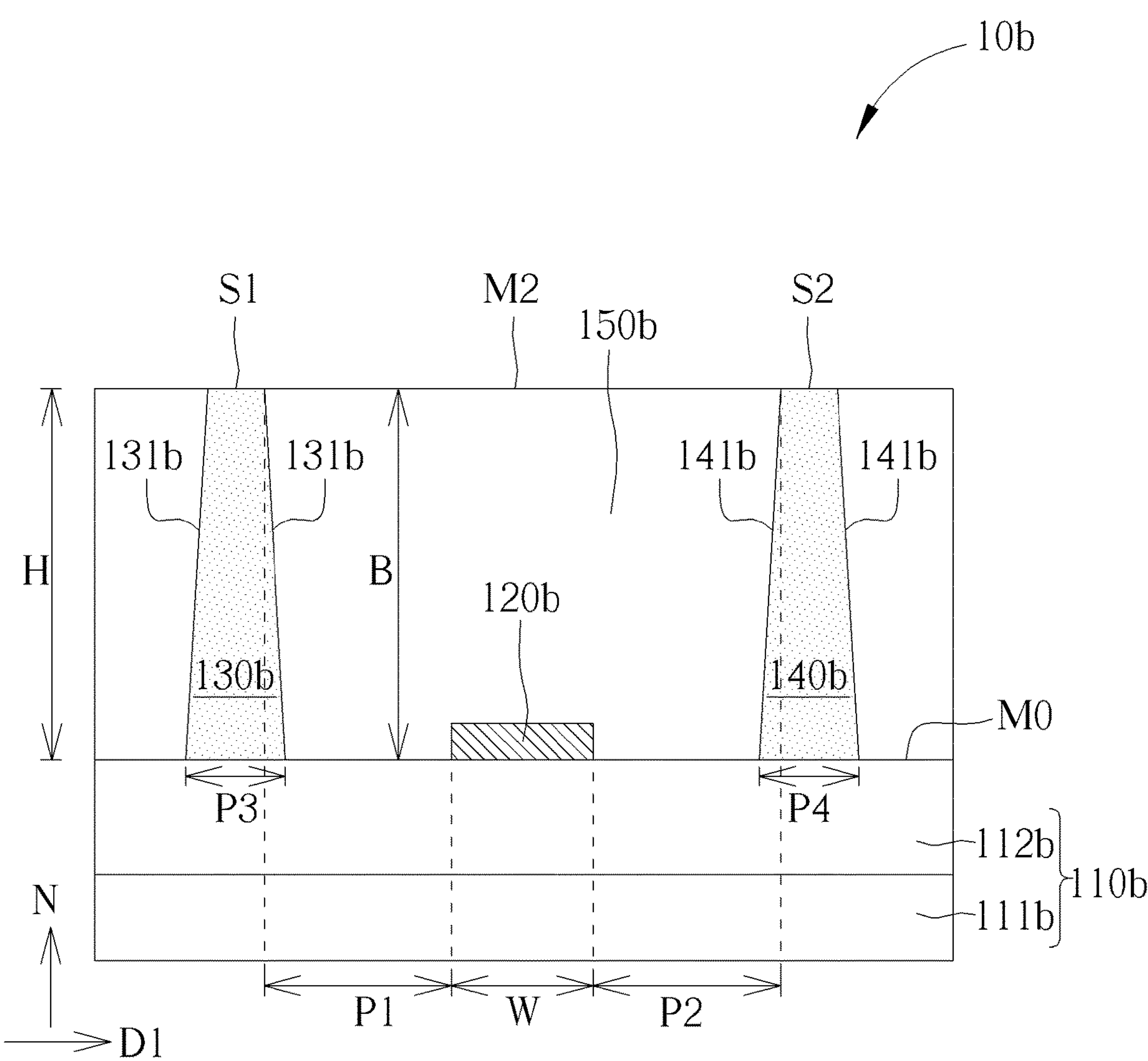
FIG. 4 is a schematic diagram showing a partial cross-sectional view of an electronic device according to yet another embodiment of the present disclosure.

FIG. 4 is a schematic diagram showing a partial cross-sectional view of an electronic device 10*b* according to yet another embodiment of the present disclosure. The view angle of the electronic device 10*b* is the same as that in FIG. 2. The electronic device 10*b* at least includes a substrate 110*b*, an electronic component 120*b*, a first blocking structure 130*b*, a second blocking structure 140*b* and/or a packaging layer 150*b*. The substrate 110*b* may include a circuit board 111*b* and/or a bottom layer 112*b*. Compared with the electronic device 10, the side surface 131*b* of the first blocking structure 130*b* of the electronic device 10*b* may be an oblique and straight surface. For example, the first blocking structure 130*b* may include two oblique and straight side surfaces 131*b* substantially symmetrical to each other. Similarly, the side surface 141*b* of the second blocking structure 140*b* may be an oblique and straight surface. For example, the second blocking structure 140*b* may include two oblique and straight side surfaces 141*b* substantially symmetrical to each other, but not limited thereto. In other words, the cross section of the space between the first blocking structure 130*b* and the second blocking structure 140*b* presents a trapezoidal profile. In some embodiments, the packaging layer 150*b* may be disposed, for example, in the space between the first blocking structure 130*b* and the second blocking structure 140*b*. In some embodiments, the width P3 of the first blocking structure 130*b* in the first direction D1 gradually decreases from the substrate 110*b* along the normal direction N away from the substrate 110*b*, but not limited thereto. In some embodiments, the width P4 of the second blocking structure 140*b* in the first direction D1 gradually decreases from the substrate 110*b* along the normal direction N away from the substrate 110*b*, but not limited thereto. The gradual decrease of the aforementioned width is not required to decrease proportionally. In some embodiments, the distance B between the surface M2 of the packaging layer 150*b* away from the substrate 110*b* and the surface M0 of the substrate 110*b* in the normal direction N is equal to the distance H, but not limited thereto. In some embodiments, the surface M2 of the packaging layer 150*b* away from the substrate 110*b* may be substantially aligned with the surface S1 of the first blocking structure 130*b* away from the substrate 110*b* and/or the surface S2 of the second blocking structure 140*b* away from the substrate 110*b*. That is, the height of the packaging layer 150*b* may be substantially equal to the height of the first blocking structure 130*b* and/or the height of the second blocking structure 140*b*, but not limited thereto. In some embodiments, the aforementioned distance B may be greater or less than the aforementioned distance H (i.e., the height of the first blocking structure 130*b*). Other details of the electronic device 10*b* shown in FIG. 4 may be the same as that of the aforementioned electronic device 10 and electronic device 10*a* if there is no contradiction, and are not repeated herein.

Figure 5:
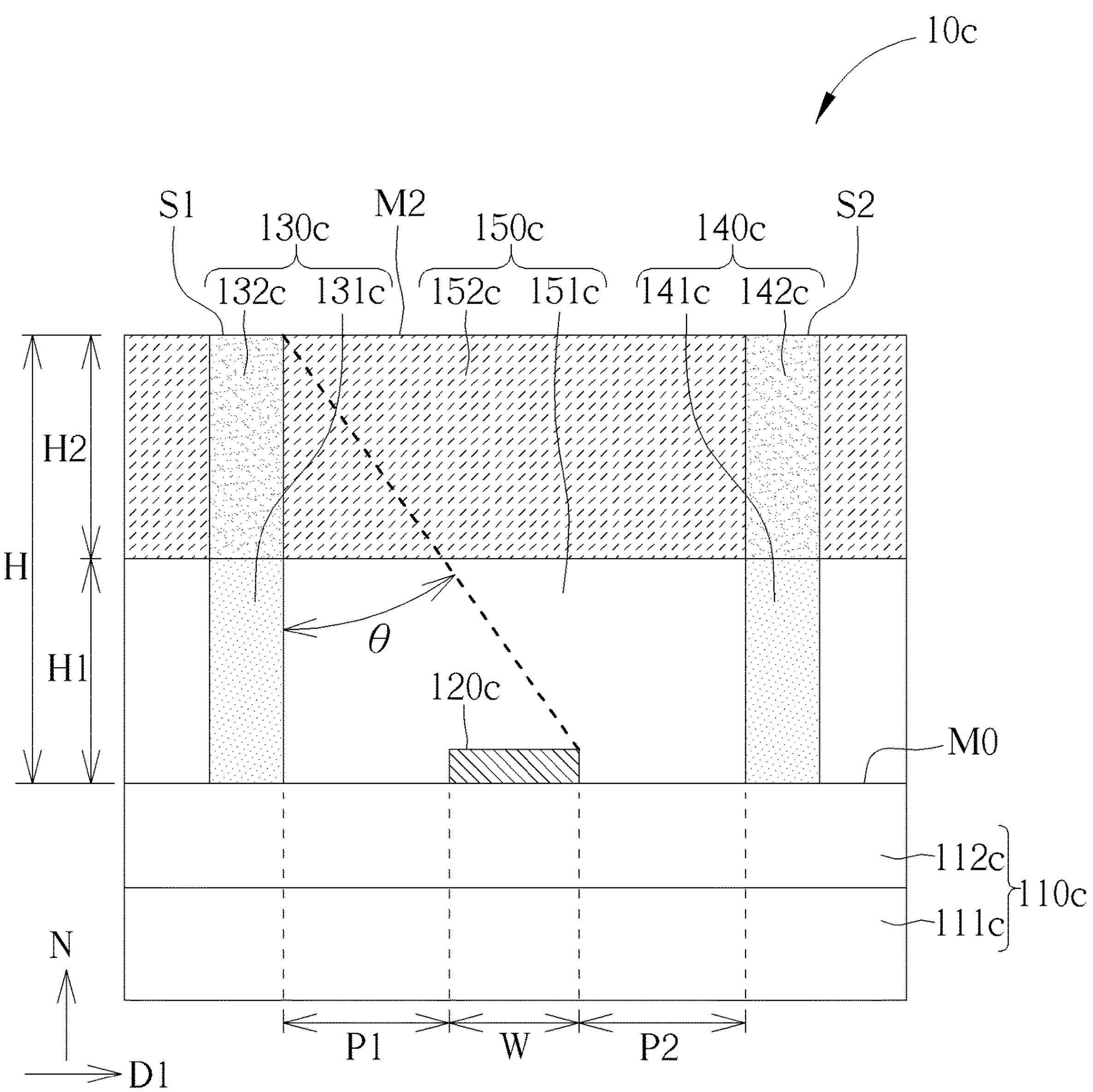
FIG. 5 is a schematic diagram showing a partial cross-sectional view of an electronic device according to yet another embodiment of the present disclosure.

FIG. 5 is a schematic diagram showing a partial cross-sectional view of an electronic device 10*c* according to yet another embodiment of the present disclosure. The view angle of the electronic device 10*c* is the same as that in FIG. 2. The electronic device 10*c* at least includes a substrate 110*c*, an electronic component 120*c*, a first blocking structure 130*c*, a second blocking structure 140*c* and/or a packaging layer 150*c*. The substrate 110*c* may include a circuit board 111*c* and/or a bottom layer 112*c*. Compared with the electronic device 10, the first blocking structure 130*c* of the electronic device 10*c* may include a multi-layer structure, and the second blocking structure 140*c* may include a multi-layer structure. In some embodiments, the packaging layer 150*c* may include a multi-layer structure. In some embodiments, the first blocking structure 130*c* exemplarily includes two sub-layers, which are a first sub-layer 131*c* and a second sub-layer 132*c* sequentially disposed on the substrate 110*c*, and the first sub-layer 131*c* and the second sub-layer 132*c* are connected with each other, but not limited thereto. The number of sub-layers of the first blocking structure 130*c* may be adjusted according to requirements. The first sub-layer 131*c* and the second sub-layer 132*c* may optionally be made of identical or different materials. The first sub-layer 131*c* and the second sub-layer 132*c* may be optionally formed by identical or different processes. Similarly, the second blocking structure 140*c* exemplarily includes two sub-layers, which are a first sub-layer 141*c* and a second sub-layer 142*c* sequentially disposed on the substrate 110*c*, and the first sub-layer 141*c* and the second sub-layer 142*c* are connected with each other, but not limited thereto. The number of sub-layers of the second blocking structure 140*c* may be adjusted according to requirements. The first sub-layer 141*c* and the second sub-layer 142*c* may optionally be made of identical or different materials. The first sub-layer 141*c* and the second sub-layer 142*c* may be optionally formed by identical or different processes. In some embodiments, the packaging layer 150*c* includes two sub-layers, which are a first sub-layer (also may be represented as the $1^{st}$ sub-layer) 151*c* and a second sub-layer (also may be represented as $2^{nd}$ sub-layer) 152*c* sequentially disposed on the electronic component 120*c*, but not limited thereto. The number of sub-layers of the packaging layer 150*c* may be adjusted according to requirements.

As shown in FIG. 5, in some embodiment, the packaging layer 150*c* may include two sub-layers (such as the first sub-layer 151*c* and the second sub-layer 152*c*). The first sub-layer 151*c* has a refractive index n1 at the wavelength of 550 nm, the first sub-layer has a height H1 in the normal direction N, the second sub-layer 152*c* has a refractive index n2 at the wavelength of 550 nm, the second sub-layer has a height H2 in the normal direction N, the electronic component 120*c* has a width W in the first direction D1 perpendicular to the normal direction N, and the width W, for example, may be defined as the maximum width of electronic component 120*c* in the first direction D1. In some embodiments, a distance H is between a surface S1 of the first blocking structure 130*c* away from the substrate 110*c* and the surface M0 of the substrate 110*c* in the normal direction N, a spaced distance P1 is between the surface S1 of the first blocking structure 130 away from the substrate 110*c* and the electronic component 120*c* in the first direction D1, and the following relationships are satisfied:

$$\sum_{i=1}^{2} Hi/ni = \lfloor (P1 + W)/\tan\theta \rfloor,$$

wherein 30°≤θ≤60°; and $$H = \sum_{i=1}^{2} Hi.$$

With the aforementioned configuration, a portion of the light emitted from the electronic component 120*c* can be blocked, for example, by the first blocking structure 130*c*, so that the emitting range of the light emitted from the electronic device 10 can be controlled. Furthermore, materials of the first sub-layer 131*c* and/or the second sub-layer 132*c* of the first blocking structure 130*c* and materials of the first sub-layer 141*c* and/or the second sub-layer 142*c* of the second blocking structure 140*c* may be selected according to actual needs. For example, materials of the first sub-layer 131*c* and/or the first sub-layer 141*c* may be light absorbing materials or light reflective materials. Materials of the second sub-layer 132*c* and/or the second sub-layer 142*c* may be light absorbing materials or light reflective materials. In some embodiments, materials of the first sub-layer 151*c* and/or the second sub-layer 152*c* may be selected according to actual needs. For example, materials of the first sub-layer 151*c* may be heat-resistant materials, so as to withstand the high temperature generated by the electronic component 120*c* during operation. Materials of the second sub-layer 152*c* may be transparent materials, so as to improve the light transmittance, but not limited thereto.

In FIG. 5, the packaging layer 150*c* includes two sub-layers, which is exemplary and the present disclosure is not limited thereto. The number of sub-layers of the packaging layer 150*c* may be adjusted according to actual needs. The number of sub-layers of the first blocking structure 130*c* and/or the number of sub-layers of the second blocking structure 140*c* may be adjusted accordingly.

In other embodiments, the packaging layer 150*c* may include m sub-layers sequentially disposed on the electronic component 120*c*, wherein m is a positive integer greater than 1. A name of each of the sub-layers is a $i^{th}$ sub-layer, the $i^{th}$ sub-layer has a refractive index ni at a wavelength of 550 nm, the $i^{th}$ sub-layer has a height Hi in the normal direction N, i is a positive integer from 1 to m, the electronic component 120*c* has a width W in the first direction D1, a distance H is between a surface S1 of the first blocking structure 130*c* away from the substrate 110*c* and the surface M0 of the substrate 110*c* in the normal direction N, a spaced distance P1 is between the surface S1 of the first blocking structure 130 away from the substrate 110*c* and the electronic component 120*c* in the first direction D1, and the following relationships are satisfied:

$$\sum_{i=1}^{m} Hi/ni = \lfloor (P1 + W)/\tan\theta \rfloor,$$

wherein 30°≤θ≤60°; and $$H = \sum_{i=1}^{m} Hi.$$

Specifically, assuming that the desired height of the first blocking structure 130*c* in the normal direction N in the air (the refractive index is approximately equals to 1) is height h, the actual height of the first blocking structure 130*c* in the normal direction N is height HB when considering the refractive index of each sub-layer of the packaging layer 150*c*, and the following relationships are satisfied:

$$h = \lfloor (P1 + W)/\tan\theta \rfloor, \text{ wherein } 30° \le \theta \le 60°;$$

$$h = H1/n1 + H2/n2 + \cdots + Hm/nm = \sum_{i=1}^{m} Hi/ni; \text{ and}$$

$$HB = H1 + H2 + \cdots Hm = \sum_{i=1}^{m} Hi.$$

Wherein, the height HB of the first blocking structure 130*c* in the normal direction N is substantially equal to the distance H between the surface S1 of the first blocking structure 130*c* away from the substrate 110*c* and the surface M0 of the substrate 110*c* in the normal direction N. The following relationship may be obtained by replacing the height h in the first formula and the second formula above:

$$\sum_{i=1}^{m} Hi/ni = \lfloor (P1 + W)/\tan\theta \rfloor.$$

Other details of the electronic device 10*c* shown in FIG. 5 may be the same as that of the aforementioned electronic device 10, electronic device 10*a* and electronic device 10*b* if there is no contradiction, and are not repeated herein.

Figure 6:
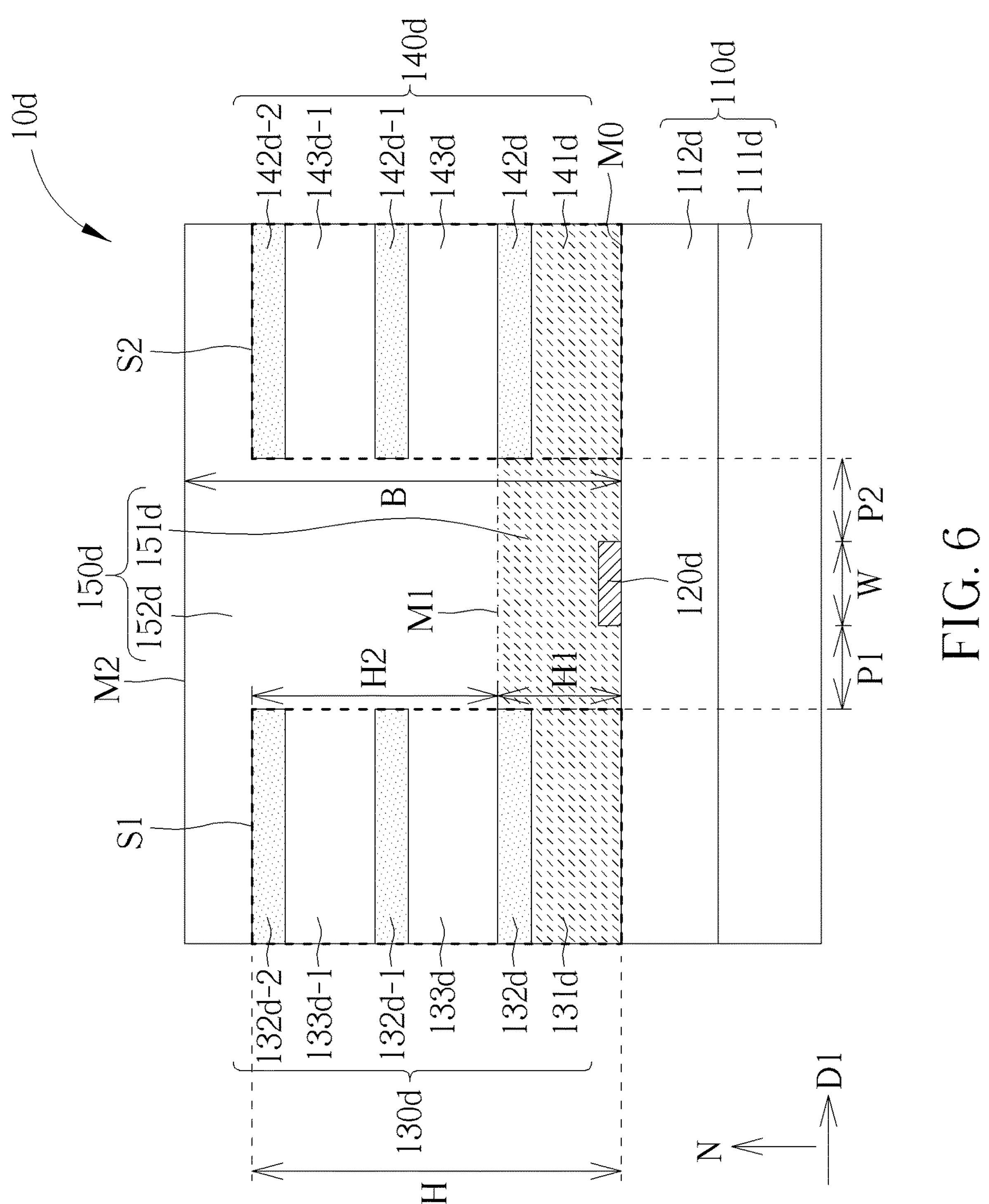
FIG. 6 is a schematic diagram showing a partial cross-sectional view of an electronic device according to yet another embodiment of the present disclosure.

FIG. 6 is a schematic diagram showing a partial cross-sectional view of an electronic device 10*d* according to yet another embodiment of the present disclosure. The view angle of the electronic device 10*d* is the same as that in FIG. 2. The electronic device 10*d* at least includes a substrate 110*d*, an electronic component 120*d*, a first blocking structure 130*d*, a second blocking structure 140*d* and/or a packaging layer 150*d*. The substrate 110*d* may include a circuit board 111*d* and/or a bottom layer 112*d*. The ranges of the first blocking structure 130*d* and the second blocking structure 140*d* are enclosed by dotted frames, so as to clearly show the positions of the first blocking structure 130*d* and the second blocking structure 140*d*, respectively. Similar to the electronic device 10*c* shown in FIG. 5, the first blocking structure 130*d* of the electronic device 10*d* may include a multi-layer structure, and the second blocking structure 140_d_ may include a multi-layer structure, but not limited thereto. In the embodiment, the packaging layer 150_d_ may optionally include a single-layer structure or multi-layer structure. Herein, the packaging layer 150_d_ exemplarily includes two sub-layers, which are a first sub-layer (also may be represented as the $1^{st}$ sub-layer) 151_d_ and a second sub-layer (also may be represented as $2^{nd}$ sub-layer) 152_d_ sequentially disposed on the electronic component 120_d_. In the embodiment, the first blocking structure 130_d_ may exemplarily include six sub-layers, which are a first sub-layer 131_d_, a second sub-layer 132_d_, a third sub-layer 133_d_, a fourth sub-layer 132_d_-1, a fifth sub-layer 133_d_-1 and/or a sixth sub-layer 132_d_-2 sequentially disposed on the substrate 110_d_. The first sub-layer 131_d_, the third sub-layer 133_d_ and/or the fifth sub-layer 133_d_-1 may include non-absorbing materials, and the second sub-layer 132_d_, the fourth sub-layer 132_d_-1 and/or the sixth sub-layer 132_d_-2 may include absorbing materials, but not limited thereto. In other words, in the embodiment, a portion of the multi-layer structure of the first blocking structure 130_d_ includes the absorbing materials, and another portion of the multi-layer structure of the first blocking structure 130_d_ includes the non-absorbing materials. In some embodiments, the first sub-layer 131_d_, the third sub-layer 133_d_ and/or the fifth sub-layer 133_d_-1 may be made of identical or different materials. For example, the first sub-layer 131_d_ may be made of heat-resistant materials, so as to withstand the high temperature generated by the electronic component 120_d_ during operation. The third sub-layer 133_d_ and/or the fifth sub-layer 133_d_-1 may be made of transparent materials, so as to improve the light transmittance, but not limited thereto. In some embodiments, the second sub-layer 132_d_, the fourth sub-layer 132_d_-1 and/or the sixth sub-layer 132_d_-2 may be made of identical or different materials. The aforementioned "non-absorbing material" refers to a material that allows light to pass through. For example, a material with a transmittance for visible light (such as visible light with a wavelength of 550 nm) greater than or equal to 60% and less than or equal to 100%. For example, the aforementioned "absorbing material" refers to a material with a transmittance for visible light (such as visible light with a wavelength of 550 nm) greater than or equal to 0% and less than 60%.

Similarly, the second blocking structure 140_d_ may exemplarily include six sub-layers, which are a first sub-layer 141_d_, a second sub-layer 142_d_, a third sub-layer 143_d_, a fourth sub-layer 142_d_-1, a fifth sub-layer 143_d_-1 and/or a sixth sub-layer 142_d_-2 sequentially disposed on the substrate 110_d_. The first sub-layer 141_d_, the third sub-layer 143_d_ and/or the fifth sub-layer 143_d_-1 may include non-absorbing materials, but not limited thereto. The second sub-layer 142_d_, the fourth sub-layer 142_d_-1 and/or the sixth sub-layer 142_d_-2 may include absorbing materials, but not limited thereto. Similarly, the first sub-layer 141_d_, the third sub-layer 143_d_ and/or the fifth sub-layer 143_d_-1 may be made of identical or different materials. For example, the first sub-layer 141_d_ may be made of heat-resistant materials, so as to withstand the high temperature generated by the electronic component 120_d_ during operation. The third sub-layer 143_d_ and/or the fifth sub-layer 143_d_-1 may be made of transparent materials, so as to improve the light transmittance, but not limited thereto. In some embodiments, the second sub-layer 142_d_, the fourth sub-layer 142_d_-1 and/or the sixth sub-layer 142_d_-2 may be made of identical or different materials. With the first blocking structure 130_d_ and/or the second blocking structure 140_d_ including a plurality of sub-layers, it is beneficial to form the first blocking structure 130_d_ and/or the second blocking structure 140_d_ by photolithography. For example, the sub-layers located at different height levels may be formed by a plurality of photolithography processes, but not limited thereto.

As shown in FIG. 6, in the embodiment, the distance H (or the height of the first blocking structure 130_d_) is the distance between the surface S1 of the absorbing material layer of the first blocking structure 130_d_ farthest from the substrate 110_d_ (herein, the sixth sub-layer 132_d_-2 located at the uppermost position) and the surface M0 of the substrate 110_d_ in the normal direction N. As mentioned above, the packaging layer 150_d_ may exemplarily include two sub-layers, which are a first sub-layer (also may be represented as the $1^{st}$ sub-layer) 151_d_ and a second sub-layer (also may be represented as $2^{nd}$ sub-layer) 152_d_. The distance B between the surface M2 of the packaging layer 150_d_ away from the substrate 110_d_ and the surface M0 of the substrate 110_d_ in the normal direction N may be selectively greater than the distance H, but not limited thereto. In this case, the height H1 of the aforementioned formula, for example, may be defined as the distance between the surface M1 of the first sub-layer (also may be represented as $1^{st}$ sub-layer) 151_d_ and the surface M0 of the substrate 110_d_ in the normal direction N. The height H2 of the aforementioned formula may be defined based on the surface S1 of the first blocking structure 130_d_ away from the substrate 110_d_. That is, the height H2 is the distance between the surface (i.e., substantially the surface M1 of the first sub-layer 151_d_) of the second sub-layer 152_d_ close to the substrate 110_d_ to the surface S1 of the first blocking structure 130_d_ away from the substrate 110_d_ in the normal direction N. Other details of the electronic device 10_d_ shown in FIG. 6 may be the same as that of the aforementioned electronic device 10, electronic device 10_a_, electronic device 10_b_ and electronic device 10_c_ if there is no contradiction, and are not repeated herein.

Figure 7:
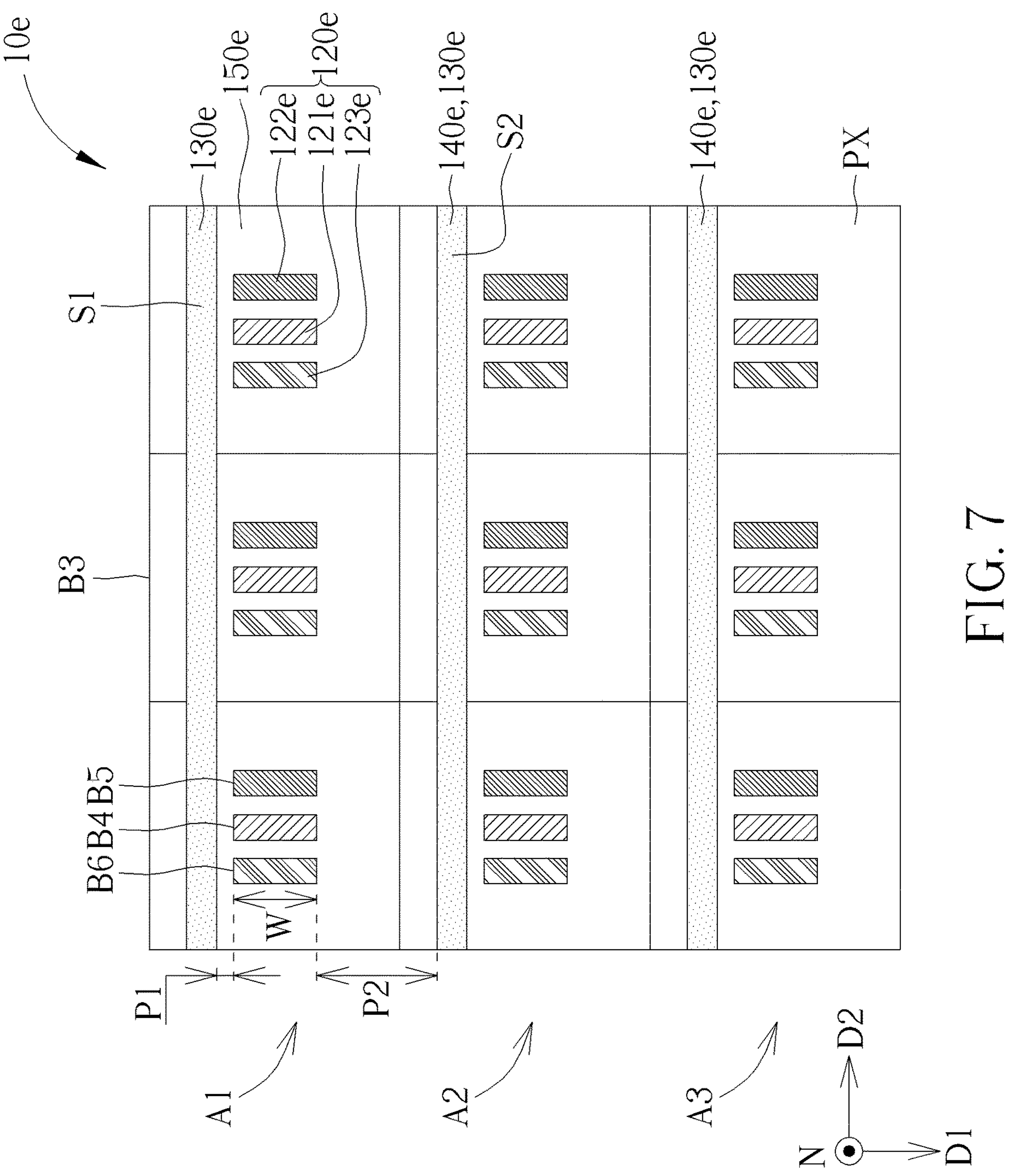
FIG. 7 is a schematic diagram showing a partial top view of an electronic device according to yet another embodiment of the present disclosure.

FIG. 7 is a schematic diagram showing a partial top view of an electronic device 10_e_ according to yet another embodiment of the present disclosure. The electronic device 10_e_ at least includes a substrate (not labeled), an electronic component 120_e_, a first blocking structure 130_e_, a second blocking structure 140_e_ and/or a packaging layer 150_e_, wherein the substrate is covered by the packaging layer 150_e_ and is not exposed. The surface M0 of the substrate (refer to the aforementioned FIG. 1) has a normal direction N. Nine electronic components 120_e_ are depicted in FIG. 7 and are arranged in three rows, i.e., the first row A1, the second row A2 and the third row A3, which is exemplary and the present disclosure is not limited thereto. Taking the electronic components 120_e_ in the first row A1 as example, the first blocking structure 130_e_ may be disposed adjacent to aside of the electronic component 120_e_ (herein, the upper side B3), and the second blocking structure 140_e_ may be disposed adjacent to another side of the electronic component 120_e_ (herein, the lower side, i.e., the side opposite to the upper side B3). The electronic component 120_e_ may include, for example, a first light emitting element 121_e_, a second light emitting element 122_e_ and/or a third light emitting element 123_e_, but not limited thereto. The first blocking structure 130_e_ and the second blocking structure 140_e_ may be arranged sequentially, for example, along the first direction D1. In the embodiment, the electronic component 120_e_ may be disposed between the first blocking structure 130_e_ and the second blocking structure 140_e_ adjacent with each other. A spaced distance P1 is between the surface S1 of the first blocking structure 130_e_ away from the substrate and the electronic component 120_e_ in the first direction D1 perpendicular to the normal direction N, a spaced distance P2 is between the surface S2 of the second blocking structure 140*e* away from the substrate and the electronic component 120*e* in the first direction D1, and the spaced distance P1 is different from the spaced distance P2. In the embodiment, the spaced distance P1 is exemplarily less than the spaced distance P2. Thereby, the light shielding effect of the electronic device 10*e* for the upper side B3 is better than the light shielding effect of the electronic device 10*e* for the lower side (i.e., the opposite side of the upper side B3). When the electronic device 10*e* is applied to a vehicle display device, the upper side B3 may be placed adjacent to the windshield, which can improve the problem that the light emitted from the electronic device 10*e* is projected onto the windshield to affects driving safety, but not limited thereto. In addition, in the embodiment, since the electronic components 120*e* are arranged in three rows, the second blocking structure 140*e* of the electronic component 120*e* in the first row A1 may be regarded as the first blocking structure 130*e* of the electronic component 120*e* in the second row A2, and the second blocking structure 140*e* of the electronic component 120*e* in the second row A2 may be regarded as the first blocking structure 130*e* of the electronic component 120*e* of the third row A3, and so on, but not limited thereto. In some embodiments, the first blocking structure 130*e* may, for example, extend along the second direction D2 and be disposed on one side of each of the multiple electronic components 120*e* at the same time. For example, the first blocking structure 130*e* may be a continuous blocking structure, but not limited thereto. In other words, the electronic components 120*e* in the same row share one first blocking structure 130*e*.

In other embodiments (not shown), the first blocking structure 130*e* may, for example, extend along the second direction D2 but not be disposed on one side of each of the multiple electronic components 120*e* at the same time. For example, the first blocking structure 130*e* may be a discontinuous blocking structure (with separated segments), but not limited thereto. In other words, the first blocking structure 130*e* shown in FIG. 7 may be replaced by three first blocking structures 130*e* (not shown) which are independent and spaced apart from each other, and each first blocking structure 130*e* corresponds to an electronic component 120*e*.

Similarly, the second blocking structure 140*e* may, for example, extend along the second direction D2 and be disposed on one side of each of the multiple electronic components 120*e* at the same time. For example, the second blocking structure 140*e* may be a continuous blocking structure, but not limited thereto. In other words, the electronic components 120*e* in the same row share one second blocking structure 140*e*. In other embodiments (not shown), the second blocking structure 140*e* may, for example, extend along the second direction D2 but not be disposed on one side of each of the multiple electronic components 120*e* at the same time. For example, the second blocking structure 140*e* may be a discontinuous blocking structure (with separated segments), but not limited thereto. In other words, the second blocking structure 140*e* shown in FIG. 7 may be replaced by three second blocking structures 140*e* (not shown) which are independent and spaced apart from each other, and each second blocking structure 140*e* corresponds to an electronic component 120*e*.

In some embodiments, FIG. 7 may shows a partial region of the electronic device 10*e*, and the designs of the spaced distance between the blocking structures and the electronic components 120*e* in different regions of the electronic device 10*e* may be adjusted according to requirements. For example, the disposition of the blocking structure and/or the spaced distance between the blocking structure and the electronic component 120*e* may be adjusted according to the light shielding requirements of different regions or different sides, or the requirement of anti-peeping or wide viewing angle.

In the embodiment, the electronic component 120*e* includes a first light emitting element 121*e*, a second light emitting element 122*e* and/or a third light emitting element 123*e*, and the upper side B4 of first light emitting element 121*e*, the upper side B5 of second light emitting element 122*e* and/or the upper side B6 of the third light emitting element 123*e* may be substantially aligned with each other along the second direction D2 perpendicular to the first direction D1, but not limited thereto. In other embodiments (not shown), the electronic component 120*e* may be arranged in other way or may be other light emitting element. In some embodiments, the upper side B4 of the first light emitting element 121*e*, the upper side B5 of the second light emitting element 122*e* and/or the upper side B6 of the third light emitting element 123*e* may not be aligned with each other. In some embodiments, the electronic component 120*e* may be a white light emitting element (not shown). The electronic device 10*e* may include a plurality of pixel regions PX, each of the pixel regions PX may be corresponding to an electronic component 120*e*. Since the function of shielding light (or anti-peeping) unilaterally or shielding light (or anti-peeping) asymmetrically is provided by the embodiment, the blocking structure may only be disposed on single side of the pixel region PX, but not limited thereto.

Figure 8:
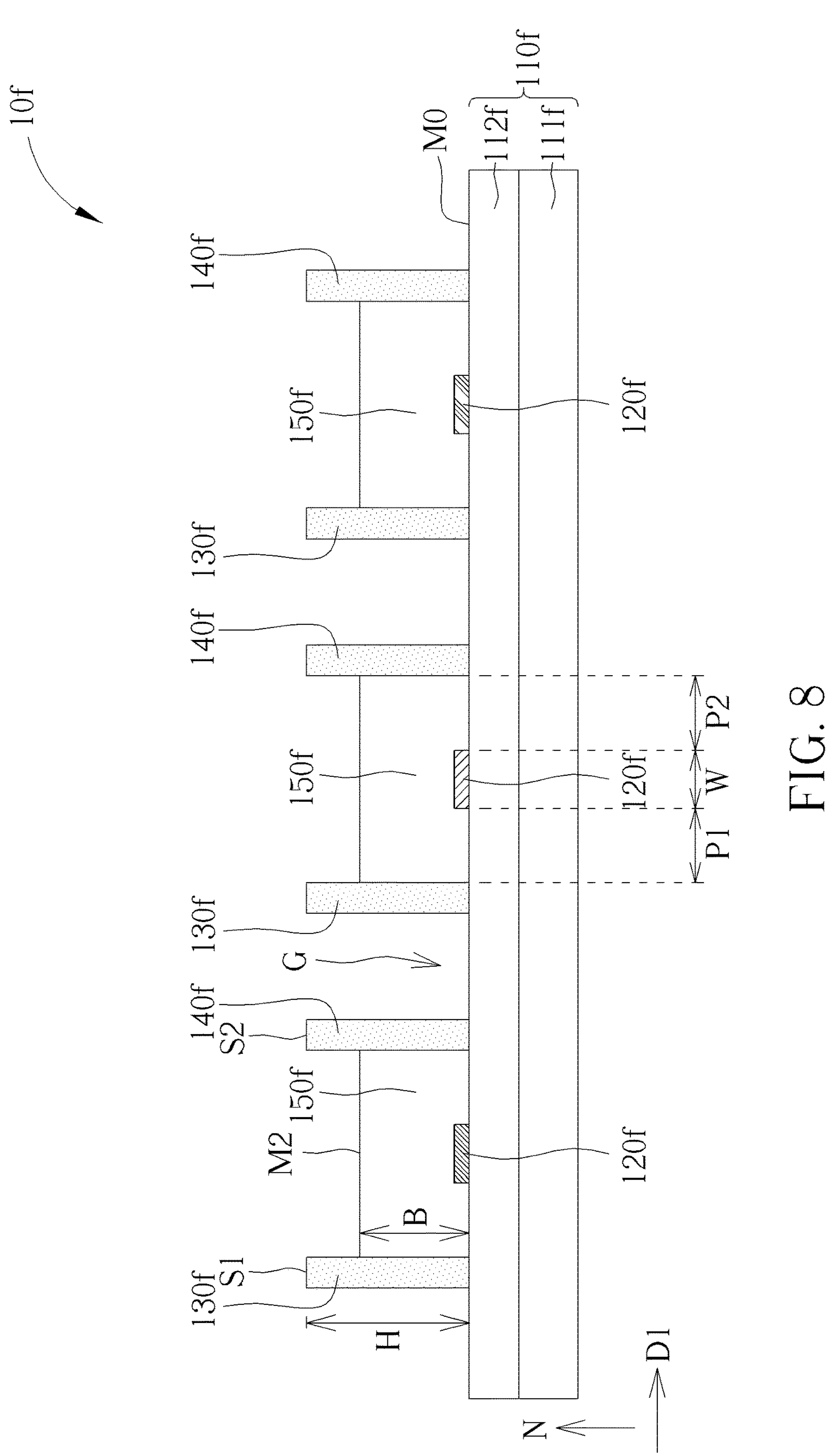
FIG. 8 is a schematic diagram showing a partial cross-sectional view of an electronic device according to yet another embodiment of the present disclosure.

FIG. 8 is a schematic diagram showing a partial cross-sectional view of an electronic device 10*f* according to yet another embodiment of the present disclosure. The electronic device 10*f* at least includes a substrate 110*f*, an electronic component 120*f*, a first blocking structure 130*f*, a second blocking structure 140*f* and/or a packaging layer 150*f*. The substrate 110*f* may include a circuit board 111*f* and/or a bottom layer 112*f*. Compared with the electronic device 10, a distance H is between the surface S1 of the first blocking structure 130*f* away from the substrate 110*f* and the surface M0 of the substrate 110*f* in the normal direction N, a distance B is between the surface M2 the packaging layer 150*f* away from the substrate 110*f* and the surface M0 of the substrate 110*f* in the normal direction N, and the distance B may be less than the distance H, but not limited thereto. There may be a gap G between the first blocking structure 130*f* and the second blocking structure 140*f* of two adjacent electronic components 120*f*, and the gap G may be optionally unfilled or filled with packaging material, but not limited thereto. Other details of the electronic device 10*f* shown in FIG. 8 may be the same as that of the aforementioned electronic device 10, electronic device 10*a*, electronic device 10*b*, electronic device 10*c* and electronic device 10*e* if there is no contradiction, and are not repeated herein.

Figure 9:
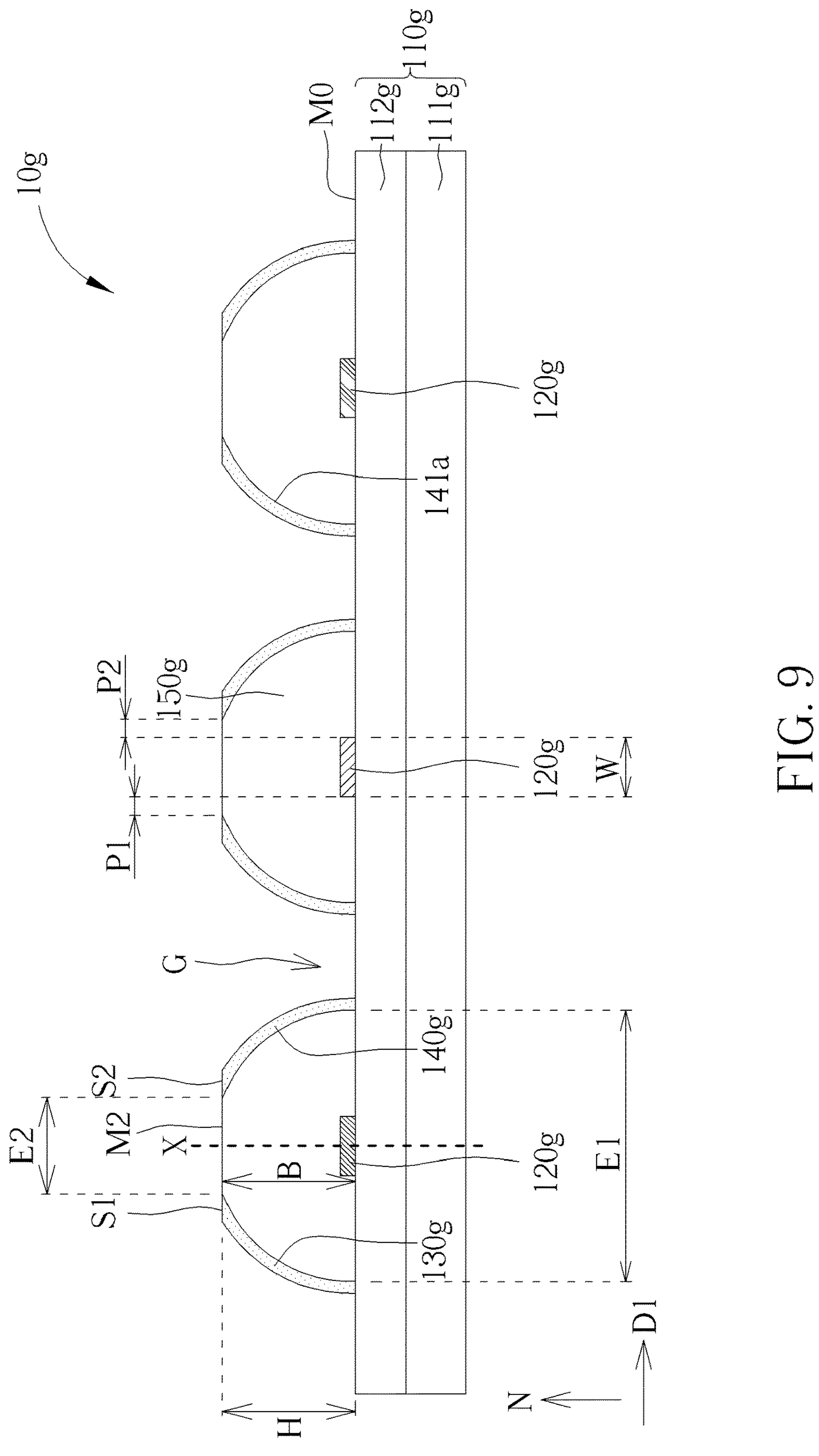
FIG. 9 is a schematic diagram showing a partial cross-sectional view of an electronic device according to yet another embodiment of the present disclosure.

FIG. 9 is a schematic diagram showing a partial cross-sectional view of an electronic device 10*g* according to yet another embodiment of the present disclosure. The electronic device 10*g* at least includes a substrate 110*g*, an electronic component 120*g*, a first blocking structure 130*g*, a second blocking structure 140*g* and/or a packaging layer 150*g*. The substrate 110*g* may include a circuit board 111*g* and/or a bottom layer 112*g*. Compared with the electronic device 10, the first blocking structure 130*g* is exemplarily an arc-shaped structure that bends toward the electronic component 120*g*, and the second blocking structure 140*g* is exemplarily an arc-shaped structure that bends toward the electronic component 120*g*, but not limited thereto. Specifically, the first blocking structure 130*g* and/or the second blocking structure 140*g* may be arranged substantially symmetrically with respect to the central axis X of the electronic component 120*g*. For the first blocking structure 130*g* and the second blocking structure 140*g* corresponding to the same electronic component 120*g*, the distance E1 between the first blocking structure 130*g* and the second blocking structure 140*g* adjacent to the surface M0 of the substrate 110*g* is exemplarily greater than the distance E2 between the first blocking structure 130*g* and the second blocking structure 140*g* away from the surface M0 of the substrate 110*g*. The distance E1 and the distance E2, for example, may be measured along the first direction D1. The distance E2, for example, is the distance between the surface S1 of the first blocking structure 130*g* away from the substrate 110*g* and the surface S2 of the second blocking structure 140*g* away from the substrate 110*g* along the first direction D1. With the above design, the space between the first blocking structure 130*g* and the second blocking structure 140*g* corresponding to the same electronic component 120*g* is, for example, an inverted U-shaped profile, but not limited thereto. In some embodiments, the surface S1 of the first blocking structure 130*g* away from the substrate 110*g*, the surface M2 of the packaging layer 150*g* away from the substrate 110*g*, and the surface S2 of the second blocking structure 140*g* away from the substrate 110*g* may be substantially aligned with each other. There may be a gap G between the first blocking structure 130*g* and the second blocking structure 140*g* of two adjacent electronic components 120*g*, and the gap G may be selectively filled or not filled with packaging materials. Other details of the electronic device 10*g* shown in FIG. 9 may be the same as that of the aforementioned electronic device 10, electronic device electronic device 10*b*, electronic device 10*c*, electronic device and electronic device 10*f* if there is no contradiction, and are not repeated herein.

Figure 10:
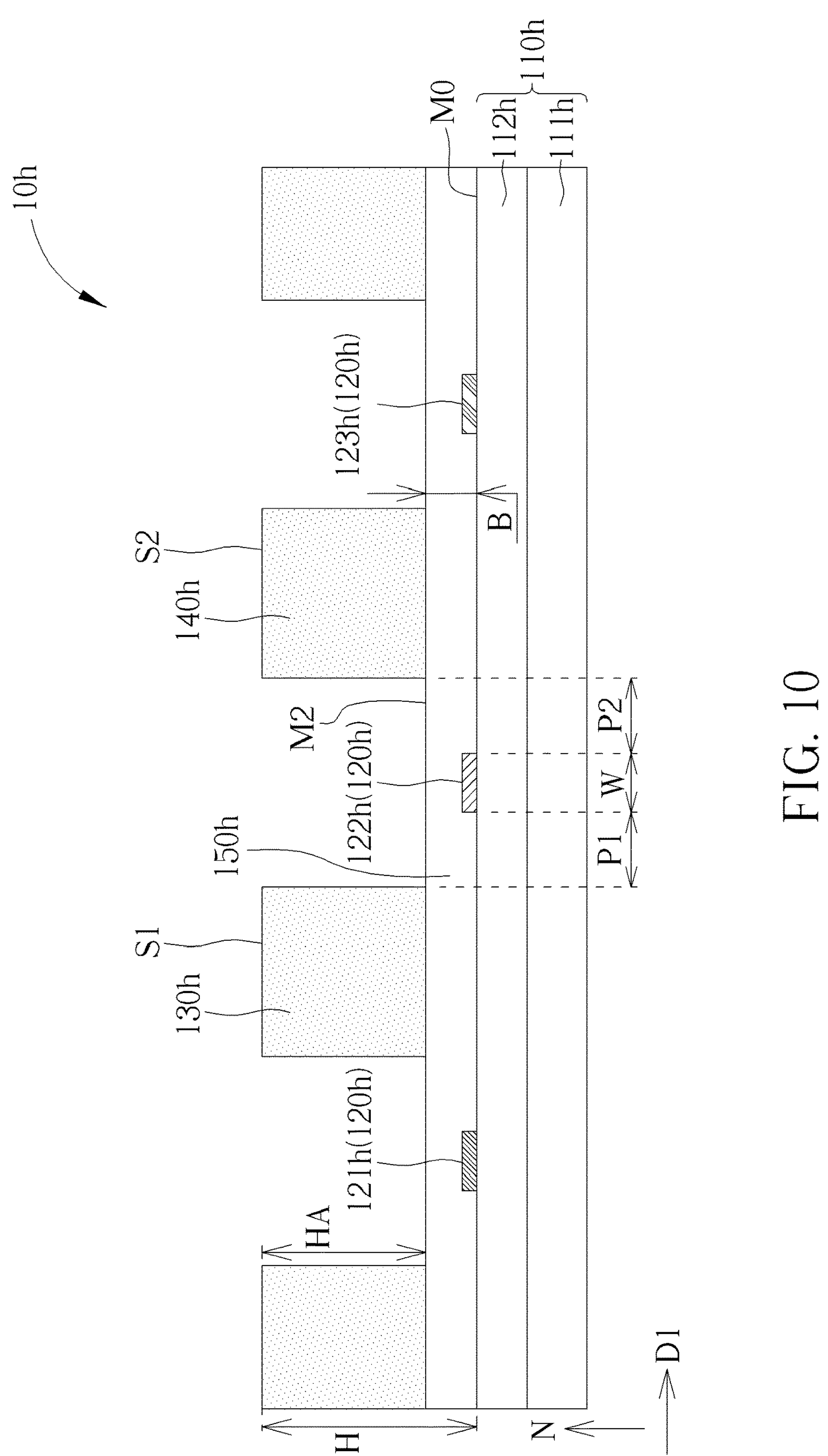
FIG. 10 is a schematic diagram showing a partial cross-sectional view of an electronic device according to yet another embodiment of the present disclosure.

FIG. 10 is a schematic diagram showing a partial cross-sectional view of an electronic device 10*h* according to yet another embodiment of the present disclosure. The electronic device at least includes a substrate 110*h*, an electronic component 120*h*, a first blocking structure 130*h*, a second blocking structure 140*h* and/or a packaging layer 150*h*. The substrate 110*h* may include a circuit board 111*h* and/or a bottom layer 112*h*. Compared with electronic device 10, two adjacent electronic components 120*h* (including the electronic component 121*h*, the electronic component 122*h* and the electronic component 123*h*) of electronic device 10*h*, for example, may share a same blocking structure. That is, the first blocking structure 130*h* of the electronic component 122*h* may be regarded as the second blocking structure of the electronic component 121*h*, the second blocking structure 140*h* of electronic component 122*h* may be regarded as the first blocking structure of electronic component 123*h*, and so on. Moreover, the first blocking structure 130*h* and/or the second blocking structure 140*h* may be disposed on the packaging layer 150*h*. That is, the packaging layer 150*h* is further disposed between the first blocking structure 130*h* and/or the second blocking structure 140*h* and the substrate 110*h*. In other words, in the embodiment, the distance H may be greater than the height HA of the first blocking structure 130*h* in the normal direction N. That is, the distance H is greater than the height HA of the first blocking structure 130*h*. Other details of the electronic device 10*h* shown in FIG. 10 may be the same as that of the aforementioned electronic device 10, electronic device 10*a*, electronic device 10*b*, electronic device 10*c*, electronic device 10*e*, electronic device 10*f* and electronic device 10*g* if there is no contradiction, and are not repeated herein.

Figure 11:
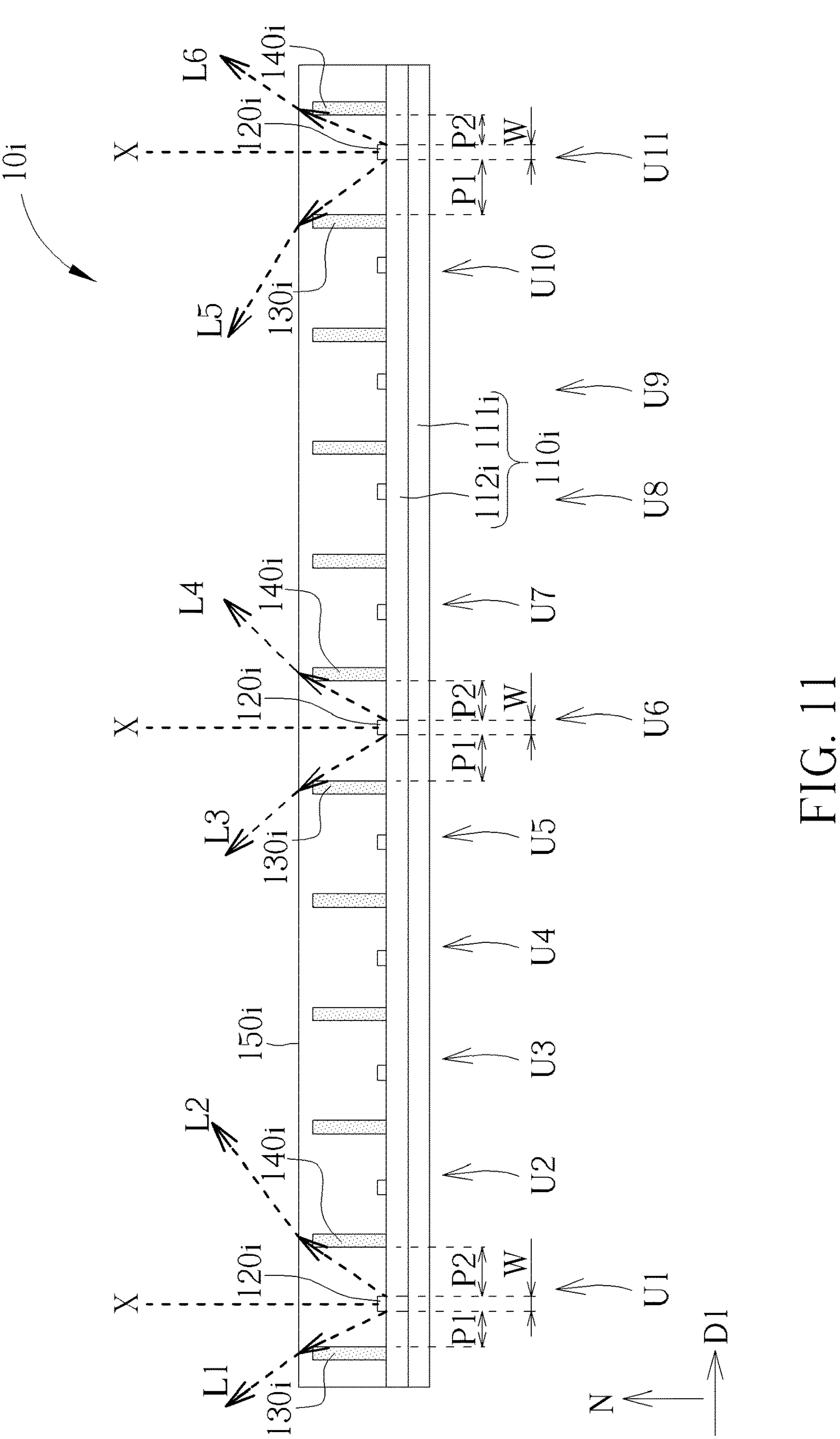
FIG. 11 is a schematic diagram showing a cross-sectional view of an electronic device according to yet another embodiment of the present disclosure.

FIG. 11 is a schematic diagram showing a cross-sectional view of an electronic device 10*i* according to yet another embodiment of the present disclosure. The electronic device 10*i* at least includes a substrate 110*i*, an electronic component 120*i*, a first blocking structure 130*i*, a second blocking structure 140*i* and/or a packaging layer 150*i*. The substrate 110*i* may include a circuit board 111*i* and/or a bottom layer 112*i*. Herein, the electronic device 10*i* may include a plurality of elements, which are element U1, element U2, element U3, element U4, element U5, element U6, element U7, element U8, element U9, element U10, element U11 from left to right in sequence, but not limited thereto. The relative positions between the electronic components 120*i* and the blocking structures of the elements may be different according to requirements. For example, for the element located at or near the center, such as the element U6, the electronic component 120*i* thereof may be substantially disposed in the center of the element U6. That is, in the element U6, the spaced distance P1 may be substantially equal to the spaced distance P2. The light emitting range of the element U6 is, for example, defined by the light ray L3 to the light ray L4. The light emitting range of the element U6 is substantially symmetrical with respect to the central axis X of the electronic component 120*i*, but not limited thereto. For the elements located at the periphery or the position away from the center, such as the element U1 and/or the element U11, the electronic component 120*i* is deviated relative to the center, wherein the position of the electronic component 120*i* of element U1 may be, for example, disposed closer to the left side. That is, in the element U1, the spaced distance P1 is less than the spaced distance P2, but not limited thereto. The light emitting range of the component U1 may be defined by the light ray L1 to the light ray L2. The light emitting range of the element U1 is asymmetrical with respect to the central axis X of the electronic component 120*i*. That is, the light emitting range near the outer side (herein, the left side) is smaller. On the contrary, the electronic component 120*i* of the element U11 may be, for example, disposed closer to the right side. That is, in the element U11, the spaced distance P1 is greater than the spaced distance P2, but not limited thereto. The light emitting range of the element U11 may be defined by the light ray L5 to the light ray L6. The light emitting range of the element U11 is asymmetrical with respect to the central axis X of the electronic component 120*i*. That is, the light emitting range near the outer side (herein, the right side) is smaller. Thereby, it is beneficial to provide the electronic device 10*i* with an anti-peeping function of left or right view angle, but limited thereto.

According to the present disclosure, with arranging the blocking structure(s) on one side or both sides of the electronic component, a light shielding or anti-peeping function may be provided. In the present disclosure, when the spaced distance between the blocking structure and the electronic component, the width of the electronic component, and the refractive index of the packaging layer satisfy a specific relationship, a predetermined light shielding or anti-peeping effect may be obtained. In some embodiments, the blocking structure may include a multi-layer structure and/or multiple material layers, and a desired height and anti-peeping effect may be achieved through a multi-stage process. Furthermore, the spaced distances between the electronic component and the blocking structures on both sides may be different, so as to achieve the effects of unilateral light shielding or anti-peeping effect, or asymmetrical light shielding or anti-peeping effect. In some embodiments, the spaced distances between the electronic component and the blocking structures on both sides thereof in different regions of a single electronic device may be changed according to the positions thereof, so that the light shielding or anti-peeping design may be more flexible. Therefore, based on the above description, more diverse functions and/or applications may be provided to the electronic device of the present disclosure.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:

a substrate, defining a normal direction perpendicular to a surface of the substrate;

an electronic component disposed on the substrate;

a first blocking structure disposed adjacent to a side of the electronic component, wherein there is a gap between the first blocking structure disposed adjacent to the side of the electronic component and a second blocking structure disposed adjacent to a side of another electronic component adjacent to the electronic component, and there is no other electronic component disposed in the gap; and a packaging layer disposed on the electronic component and having a refractive index n at a wavelength of 550 nm;

wherein the electronic component has a width W in a first direction perpendicular to the normal direction, a distance H is between a surface of the first blocking structure away from the substrate and the surface of the substrate in the normal direction, a spaced distance P1 is between the surface of the first blocking structure away from the substrate and the electronic component in the first direction, and following relationship is satisfied:

$$H=n\times[(P1+W)/\tan\theta],\text{ wherein }30^\circ\le\theta\le60^\circ.$$

2. The electronic device of claim 1, further comprising:

another second blocking structure disposed adjacent to another side of the electronic component, wherein the first blocking structure and the another second blocking structure are sequentially arranged along the first direction, a spaced distance P2 is between a surface of the another second blocking structure away from the substrate and the electronic component in the first direction, and the spaced distance P1 is different from the spaced distance P2.

3. The electronic device of claim 2, wherein the spaced distance P1 and the spaced distance P2 satisfy following relationship:

$$1<P2/P1\le4.$$

4. The electronic device of claim 1, wherein the distance H satisfies following formula:

$$30\ \mu m\le H\le150\ \mu m.$$

5. The electronic device of claim 1, wherein the first blocking structure comprises a multi-layer structure, a portion of the multi-layer structure comprises an absorbing material, and another portion of the multi-layer structure comprises a non-absorbing material.

6. The electronic device of claim 1, wherein a distance B is between a surface of the packaging layer away from the substrate and the surface of the substrate in the normal direction, and the distance B is different from the distance H.

7. The electronic device of claim 1, wherein a side surface of the first blocking structure is a curved surface or an oblique and straight surface.

8. The electronic device of claim 1, wherein the first blocking structure has a width in the first direction, and the width of the first blocking structure changes gradually from the substrate along the normal direction away from the substrate.

9. The electronic device of claim 1, wherein the electronic device comprises a plurality of the electronic components arranged in a second direction different from the first direction, and the first blocking structure extends along the second direction to be disposed at a same side of the plurality of the electronic components and adjacent to the plurality of the electronic components.

10. An electronic device, comprising:

a substrate, defining a normal direction perpendicular to a surface of the substrate;

an electronic component disposed on the substrate;

a first blocking structure disposed adjacent to a side of the electronic component, wherein there is a gap between the first blocking structure disposed adjacent to the side of the electronic component and a second blocking structure disposed adjacent to a side of another electronic component adjacent to the electronic component, and there is no other electronic component disposed in the gap; and a packaging layer comprising m sub-layers sequentially disposed on the electronic component, wherein m is a positive integer greater than 1;

wherein a name of each of the sub-layers is defined as a $i^{th}$ sub-layer, the $i^{th}$ sub-layer has a refractive index ni at a wavelength of 550 nm, the $i^{th}$ sub-layer has a height Hi in the normal direction, i is a positive integer from 1 to m, the electronic component has a width W in a first direction perpendicular to the normal direction, a distance H is between a surface of the first blocking structure away from the substrate and the surface of the substrate in the normal direction, a spaced distance P1 is between the surface of the first blocking structure away from the substrate and the electronic component in the first direction, and following relationships are satisfied:

$$\sum_{i=3}^{m}Hi/ni=[(P1+W)/\tan\theta],$$

wherein 30°≤θ≤60°, and $$H=\sum_{i=3}^{m}Hi.$$

11. The electronic device of claim 10, further comprising:

another second blocking structure disposed adjacent to another side of the electronic component, wherein the first blocking structure and the another second blocking structure are sequentially arranged along the first direction, a spaced distance P2 is between a surface of the another second blocking structure away from the substrate and the electronic component in the first direction, and the spaced distance P1 is different from the spaced distance P2.

12. The electronic device of claim 11, wherein the spaced distance P1 and the spaced distance P2 satisfy following relationship:

$$1<P2/P1\leq 4.$$

13. The electronic device of claim 10, wherein the distance H satisfies following formula:

$$30\ \mu m\leq H\leq 150\ \mu m.$$

14. The electronic device of claim 10, wherein the first blocking structure comprises a multi-layer structure, a portion of the multi-layer structure comprises an absorbing material, and another portion of the multi-layer structure comprises a non-absorbing material.

15. The electronic device of claim 10, wherein a distance B is between a surface of the packaging layer away from the substrate and the surface of the substrate in the normal direction, and the distance B is different from the distance H.

16. The electronic device of claim 10, wherein a side surface of the first blocking structure is a curved surface or an oblique and straight surface.

17. The electronic device of claim 10, wherein the first blocking structure has a width in the first direction, and the width of the first blocking structure changes gradually from the substrate along the normal direction away from the substrate.

18. The electronic device of claim 10, wherein the electronic device comprises a plurality of the electronic components arranged in a second direction different from the first direction, and the first blocking structure extends along the second direction to be disposed at a same side of the plurality of the electronic components and adjacent to the plurality of the electronic components.

* * * * *